US010062587B2

(12) United States Patent
Chen et al.

(10) Patent No.: US 10,062,587 B2
(45) Date of Patent: *Aug. 28, 2018

(54) PEDESTAL WITH MULTI-ZONE TEMPERATURE CONTROL AND MULTIPLE PURGE CAPABILITIES

(71) Applicant: Applied Materials, Inc., Santa Clara, CA (US)

(72) Inventors: Xinglong Chen, San Jose, CA (US); Jang-Gyoo Yang, San Jose, CA (US); Alexander Tam, Union City, CA (US); Elisha Tam, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 72 days.

This patent is subject to a terminal disclaimer.

(21) Appl. No.: 14/996,621

(22) Filed: Jan. 15, 2016

(65) Prior Publication Data
US 2016/0126118 A1    May 5, 2016

Related U.S. Application Data

(62) Division of application No. 13/723,516, filed on Dec. 21, 2012, now Pat. No. 9,267,739.

(Continued)

(51) Int. Cl.
B23Q 3/00 (2006.01)
H01L 21/67 (2006.01)
F28D 15/00 (2006.01)

(52) U.S. Cl.
CPC ........ H01L 21/67103 (2013.01); F28D 15/00 (2013.01); H01L 21/67109 (2013.01)

(58) Field of Classification Search
CPC ......... H01L 21/67103; H01L 21/67109; F28D 15/00
See application file for complete search history.

(56) References Cited

U.S. PATENT DOCUMENTS 2,369,620 A   2/1945  Sullivan et al.
3,401,302 A   9/1968  Thorpe
(Continued)

FOREIGN PATENT DOCUMENTS

CN   1124364 A   6/1996
CN   1847450 A   10/2006
(Continued)

OTHER PUBLICATIONS

Instrument Manual: Vacuum Gauge Model MM200, Rev D. TELEVAC (website: www.televac.com), A Division of the Fredericks Company, Huntingdon Valley, PA, US. 2008. pp. 162.

(Continued)

Primary Examiner — David Bryant
Assistant Examiner — Nirvana Deonauth
(74) Attorney, Agent, or Firm — Kilpatrick Townsend & Stockton LLP

(57) ABSTRACT

Substrate support assemblies for a semiconductor processing apparatus are described. The assemblies may include a pedestal and a stem coupled with the pedestal. The pedestal may be configured to provide multiple regions having independently controlled temperatures. Each region may include a fluid channel to provide a substantially uniform temperature control within the region, by circulating a temperature controlled fluid that is received from and delivered to internal channels in the stem. The fluid channels may include multiple portions configured in a parallel-reverse flow arrangement. The pedestal may also include fluid purge channels that may be configured to provide thermal isolation between the regions of the pedestal.

18 Claims, 7 Drawing Sheets

Related U.S. Application Data

(60) Provisional application No. 61/673,067, filed on Jul. 18, 2012.

(56) References Cited

U.S. PATENT DOCUMENTS

| | | | |
|---|---|---|---|
| 3,451,840 | A | 6/1969 | Hough |
| 3,537,474 | A | 11/1970 | Rohrer |
| 3,756,511 | A | 9/1973 | Shinroku |
| 3,937,857 | A | 2/1976 | Brummett et al. |
| 3,969,077 | A | 7/1976 | Hill |
| 4,006,047 | A | 2/1977 | Brummett et al. |
| 4,209,357 | A | 6/1980 | Gorin et al. |
| 4,214,946 | A | 7/1980 | Forget et al. |
| 4,232,060 | A | 11/1980 | Mallory, Jr. |
| 4,234,628 | A | 11/1980 | DuRose |
| 4,265,943 | A | 5/1981 | Goldstein et al. |
| 4,340,462 | A | 7/1982 | Koch |
| 4,361,418 | A | 11/1982 | Tscheppe |
| 4,361,441 | A | 11/1982 | Tylko |
| 4,364,803 | A | 12/1982 | Nidola et al. |
| 4,368,223 | A | 1/1983 | Kobayashi et al. |
| 4,374,698 | A | 2/1983 | Sanders et al. |
| 4,397,812 | A | 8/1983 | Mallory, Jr. |
| 4,468,413 | A | 8/1984 | Bachmann |
| 4,565,601 | A | 1/1986 | Kakehi et al. |
| 4,579,618 | A | 4/1986 | Celestino et al. |
| 4,585,920 | A | 4/1986 | Hoog et al. |
| 4,625,678 | A | 12/1986 | Shloya et al. |
| 4,632,857 | A | 12/1986 | Mallory, Jr. |
| 4,656,052 | A | 4/1987 | Satou et al. |
| 4,656,076 | A | 4/1987 | Vetanen et al. |
| 4,668,335 | A | 5/1987 | Mockler |
| 4,690,746 | A | 9/1987 | McInerney et al. |
| 4,715,937 | A | 12/1987 | Moslehi et al. |
| 4,749,440 | A | 6/1988 | Blackwood et al. |
| 4,753,898 | A | 6/1988 | Parrillo et al. |
| 4,786,360 | A | 11/1988 | Cote et al. |
| 4,793,897 | A | 12/1988 | Dunfield et al. |
| 4,807,016 | A | 2/1989 | Douglas |
| 4,810,520 | A | 3/1989 | Wu |
| 4,816,638 | A | 3/1989 | Ukai et al. |
| 4,820,377 | A | 4/1989 | Davis et al. |
| 4,828,649 | A | 5/1989 | Davis |
| 4,857,140 | A | 8/1989 | Loewenstein |
| 4,904,621 | A | 2/1990 | Lowenstein et al. |
| 4,913,929 | A | 4/1990 | Moslehi et al. |
| 4,946,903 | A | 8/1990 | Gardella et al. |
| 4,951,601 | A | 8/1990 | Maydan et al. |
| 4,960,488 | A | 10/1990 | Law et al. |
| 4,980,018 | A | 12/1990 | Mu et al. |
| 4,981,551 | A | 1/1991 | Palmour |
| 4,985,372 | A | 1/1991 | Narita et al. |
| 4,991,542 | A | 2/1991 | Kohmura et al. |
| 4,992,136 | A | 2/1991 | Tachi et al. |
| 4,993,358 | A | 2/1991 | Mahawili |
| 4,994,404 | A | 2/1991 | Sheng et al. |
| 5,000,113 | A | 3/1991 | Wang et al. |
| 5,006,192 | A | 4/1991 | Deguchi |
| 5,013,691 | A | 5/1991 | Lory et al. |
| 5,028,565 | A | 7/1991 | Chang |
| 5,030,319 | A | 7/1991 | Nishino et al. |
| 5,038,713 | A | 8/1991 | Kawakami et al. |
| 5,045,244 | A | 9/1991 | Marlett |
| 5,061,838 | A | 10/1991 | Lane et al. |
| 5,083,030 | A | 1/1992 | Stavov |
| 5,089,441 | A | 2/1992 | Moslehi |
| 5,089,442 | A | 2/1992 | Olmer |
| 5,147,692 | A | 9/1992 | Bengston |
| 5,156,881 | A | 10/1992 | Okano et al. |
| 5,180,435 | A | 1/1993 | Markunas et al. |
| 5,186,718 | A | 2/1993 | Tepman et al. |
| 5,188,706 | A | 2/1993 | Hori et al. |
| 5,198,034 | A | 3/1993 | deBoer et al. |
| 5,203,911 | A | 4/1993 | Sricharoenchalkit et al. |
| 5,215,787 | A | 6/1993 | Homma |
| 5,228,501 | A | 7/1993 | Tepman et al. |
| 5,231,690 | A | 7/1993 | Soma et al. |
| 5,235,139 | A | 8/1993 | Bengston et al. |
| 5,238,499 | A | 8/1993 | van de Ven et al. |
| 5,240,497 | A | 8/1993 | Shacham et al. |
| 5,248,371 | A | 9/1993 | Maher et al. |
| 5,248,527 | A | 9/1993 | Uchida et al. |
| 5,252,178 | A | 10/1993 | Moslehi |
| 5,266,157 | A | 11/1993 | Kadomura |
| 5,269,881 | A | 12/1993 | Sekiya |
| 5,270,125 | A | 12/1993 | America et al. |
| 5,271,972 | A | 12/1993 | Kwok et al. |
| 5,275,977 | A | 1/1994 | Otsubo et al. |
| 5,277,750 | A | 1/1994 | Wolgang |
| 5,279,669 | A | 1/1994 | Lee |
| 5,279,865 | A | 1/1994 | Chebi et al. |
| 5,288,518 | A | 2/1994 | Homma |
| 5,290,382 | A | 3/1994 | Zarowin et al. |
| 5,292,370 | A | 3/1994 | Tsai et al. |
| 5,292,682 | A | 3/1994 | Stevens et al. |
| 5,300,463 | A | 4/1994 | Cathey et al. |
| 5,302,233 | A | 4/1994 | Kim et al. |
| 5,304,250 | A | 4/1994 | Sameshima et al. |
| 5,306,530 | A | 4/1994 | Strongin et al. |
| 5,314,724 | A | 5/1994 | Tsukune et al. |
| 5,319,247 | A | 6/1994 | Matsuura |
| 5,326,427 | A | 7/1994 | Jerbic |
| 5,328,558 | A | 7/1994 | Kawamura et al. |
| 5,328,810 | A | 7/1994 | Lowrey et al. |
| 5,330,578 | A | 7/1994 | Sakama |
| 5,334,552 | A | 8/1994 | Homma |
| 5,345,999 | A | 9/1994 | Hosokawa |
| 5,352,636 | A | 10/1994 | Beinglass |
| 5,356,478 | A | 10/1994 | Chen et al. |
| 5,362,526 | A | 11/1994 | Wang et al. |
| 5,368,897 | A | 11/1994 | Kurihara et al. |
| 5,378,316 | A | 1/1995 | Franke et al. |
| 5,380,560 | A | 1/1995 | Kaja et al. |
| 5,382,311 | A | 1/1995 | Ishikawa et al. |
| 5,384,284 | A | 1/1995 | Doan et al. |
| 5,385,763 | A | 1/1995 | Okano et al. |
| 5,399,237 | A | 3/1995 | Keswick et al. |
| 5,399,529 | A | 3/1995 | Homma |
| 5,403,434 | A | 4/1995 | Moslehi |
| 5,413,670 | A | 5/1995 | Langan et al. |
| 5,413,967 | A | 5/1995 | Matsuda et al. |
| 5,415,890 | A | 5/1995 | Kloiber et al. |
| 5,416,048 | A | 5/1995 | Blalock et al. |
| 5,420,075 | A | 5/1995 | Homma et al. |
| 5,429,995 | A | 7/1995 | Nishiyama et al. |
| 5,439,553 | A | 8/1995 | Grant et al. |
| 5,451,259 | A | 9/1995 | Krogh |
| 5,464,499 | A | 11/1995 | Moslehi |
| 5,468,342 | A | 11/1995 | Nulty et al. |
| 5,474,589 | A | 12/1995 | Ohga et al. |
| 5,478,403 | A | 12/1995 | Shinigawa et al. |
| 5,478,462 | A | 12/1995 | Walsh |
| 5,483,920 | A | 1/1996 | Pryor |
| 5,500,249 | A | 3/1996 | Telford et al. |
| 5,505,816 | A | 4/1996 | Barnes et al. |
| 5,510,216 | A | 4/1996 | Calabrese et al. |
| 5,516,367 | A | 5/1996 | Lei et al. |
| 5,518,962 | A | 5/1996 | Murao |
| 5,531,835 | A | 7/1996 | Fodor et al. |
| 5,534,070 | A | 7/1996 | Okamura et al. |
| 5,536,360 | A | 7/1996 | Nguyen et al. |
| 5,549,780 | A | 8/1996 | Koinuma et al. |
| 5,558,717 | A | 9/1996 | Zhao et al. |
| 5,560,779 | A | 10/1996 | Knowles et al. |
| 5,563,105 | A | 10/1996 | Dobuzinsky et al. |
| 5,567,243 | A | 10/1996 | Foster et al. |
| 5,571,576 | A | 11/1996 | Qian et al. |
| 5,575,853 | A | 11/1996 | Arami et al. |
| 5,578,130 | A | 11/1996 | Hayashi et al. |
| 5,578,161 | A | 11/1996 | Auda |
| 5,580,421 | A | 12/1996 | Hiatt et al. |
| 5,591,269 | A | 1/1997 | Arami et al. |
| 5,592,358 | A | 1/1997 | Shamouilian |
| 5,599,740 | A | 2/1997 | Jang et al. |

(56) References Cited

U.S. PATENT DOCUMENTS

| | | |
|---|---|---|
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,788,825 A | 8/1998 | Park et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,835,334 A | 11/1998 | McMillin et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,863,376 A | 1/1999 | Wicker |
| 5,865,896 A | 2/1999 | Nowak |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,913,978 A | 6/1999 | Kato et al. |
| 5,915,190 A | 6/1999 | Pirkle |
| 5,918,116 A | 6/1999 | Chittipeddi |
| 5,919,332 A | 7/1999 | Koshiishi et al. |
| 5,920,792 A | 7/1999 | Lin |
| 5,926,737 A | 7/1999 | Ameen et al. |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,147 A | 6/2000 | Koshiishi |
| 6,072,227 A | 6/2000 | Yau et al. |
| 6,074,512 A | 6/2000 | Collins et al. |
| 6,077,384 A | 6/2000 | Collins et al. |
| 6,077,780 A | 6/2000 | Dubin |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,120,640 A | 9/2000 | Shih et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |

(56) References Cited

U.S. PATENT DOCUMENTS

| | | | |
|---|---|---|---|
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,161,576 A | 12/2000 | Maher et al. |
| 6,162,302 A | 12/2000 | Raghavan et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,184,121 B1 | 2/2001 | Buchwalter et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,303,044 B1 | 10/2001 | Koemtzopoulos |
| 6,303,418 B1 | 10/2001 | Cha et al. |
| 6,306,772 B1 | 10/2001 | Lin |
| 6,308,776 B1 | 10/2001 | Sloan |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,051 B1 | 10/2002 | Sahin et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |

(56) References Cited

U.S. PATENT DOCUMENTS

| | | |
|---|---|---|
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,677,242 B1 | 1/2004 | Liu et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,853,533 B2 * | 2/2005 | Parkhe .............. H01L 21/67248 361/234 |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,052,553 B1 | 5/2006 | Shih et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,291,360 B2 | 11/2007 | Hanawa et al. |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,915,139 B1 | 3/2011 | Lang et al. |
| 7,922,863 B2 | 4/2011 | Ripley |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |

(56) References Cited

U.S. PATENT DOCUMENTS

| | | |
|---|---|---|
| 8,114,245 B2 | 2/2012 | Ohmi et al. |
| 8,119,530 B2 | 2/2012 | Hori et al. |
| 8,133,349 B1 | 3/2012 | Panagopoulos |
| 8,173,228 B2 | 5/2012 | Choi et al. |
| 8,183,134 B2 | 5/2012 | Wu |
| 8,187,486 B1 | 5/2012 | Liu et al. |
| 8,211,808 B2 | 7/2012 | Sapre et al. |
| 8,216,486 B2 | 7/2012 | Dhindsa |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,336,188 B2 | 12/2012 | Monteen |
| 8,357,435 B2 | 1/2013 | Lubomirsky |
| 8,368,308 B2 | 2/2013 | Banna et al. |
| 8,390,980 B2 | 3/2013 | Sansoni et al. |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Sansoni et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,471 B2 | 1/2014 | Tyler et al. |
| 8,652,298 B2 | 2/2014 | Dhindsa et al. |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,741,778 B2 | 6/2014 | Yang et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,888,087 B2 | 11/2014 | Okabe et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 | 6/2015 | Ikeda et al. |
| 9,093,371 B2 | 7/2015 | Wang et al. |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |
| 9,190,293 B2 | 11/2015 | Wang et al. |
| 9,190,302 B2 | 11/2015 | Ni |
| 9,209,012 B2 | 12/2015 | Chen et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,269,590 B2 | 2/2016 | Luere et al. |
| 9,275,834 B1 | 3/2016 | Park et al. |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhang et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,418,858 B2 | 8/2016 | Wang et al. |
| 9,425,058 B2 | 8/2016 | Kim et al. |
| 9,431,268 B2 | 8/2016 | Lill et al. |
| 9,437,451 B2 | 9/2016 | Chen et al. |
| 9,443,749 B2 | 9/2016 | Smith |
| 9,449,845 B2 | 9/2016 | Liu et al. |
| 9,449,846 B2 | 9/2016 | Liu et al. |
| 9,449,850 B2 | 9/2016 | Wang et al. |
| 9,466,469 B2 | 10/2016 | Khaja |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |

(56) References Cited

U.S. PATENT DOCUMENTS

| | | |
|---|---|---|
| 9,576,809 B2 | 2/2017 | Korolik et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,792 B2 | 5/2017 | Wang et al. |
| 9,691,645 B2 | 6/2017 | Ayers |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 2001/0006093 A1 | 7/2001 | Tabuchi |
| 2001/0008803 A1 | 7/2001 | Takamatsu et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |
| 2001/0042512 A1 | 11/2001 | Xu et al. |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2002/0000202 A1 | 1/2002 | Yuda et al. |
| 2002/0001778 A1 | 1/2002 | Latchford et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell et al. |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0187280 A1 | 12/2002 | Johnson et al. |
| 2002/0187655 A1 | 12/2002 | Tan et al. |
| 2003/0003757 A1 | 1/2003 | Naltan et al. |
| 2003/0007910 A1 | 1/2003 | Lazarovich et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0152691 A1 | 8/2003 | Baude |
| 2003/0159307 A1* | 8/2003 | Sago ............ H01L 21/67109 34/107 |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0209323 A1 | 11/2003 | Yokogaki et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099285 A1 | 5/2004 | Wang et al. |
| 2004/0099378 A1 | 5/2004 | Kim et al. |
| 2004/0101667 A1 | 5/2004 | O'Loughlin et al. |
| 2004/0107908 A1 | 6/2004 | Collins et al. |
| 2004/0108067 A1 | 6/2004 | Fischione et al. |

(56) References Cited

U.S. PATENT DOCUMENTS

| | | |
|---|---|---|
| 2004/0108068 A1 | 6/2004 | Senzaki et al. |
| 2004/0115876 A1 | 6/2004 | Goundar et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144490 A1 | 7/2004 | Zhao et al. |
| 2004/0147126 A1 | 7/2004 | Yamashita et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0200499 A1 | 10/2004 | Harvey |
| 2004/0211357 A1 | 10/2004 | Gadgil et al. |
| 2004/0219737 A1 | 11/2004 | Quon |
| 2004/0219789 A1 | 11/2004 | Wood et al. |
| 2004/0231706 A1 | 11/2004 | Bhatnagar et al. |
| 2004/0263827 A1 | 12/2004 | Xu |
| 2005/0000432 A1 | 1/2005 | Keller et al. |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0073051 A1 | 4/2005 | Yamamoto et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0105991 A1 | 5/2005 | Hofmeister et al. |
| 2005/0112876 A1 | 5/2005 | Wu |
| 2005/0112901 A1 | 5/2005 | Ji et al. |
| 2005/0136188 A1 | 6/2005 | Chang |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0181588 A1 | 8/2005 | Kim |
| 2005/0183666 A1 | 8/2005 | Tsuji et al. |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1 | 9/2005 | Hanawa et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0287755 A1 | 12/2005 | Bachmann et al. |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0060942 A1 | 3/2006 | Minixhofer et al. |
| 2006/0065629 A1 | 3/2006 | Chen et al. |
| 2006/0087644 A1 | 4/2006 | McMillin et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0118178 A1 | 6/2006 | Desbiolles et al. |
| 2006/0121724 A1 | 6/2006 | Yue et al. |
| 2006/0124242 A1 | 6/2006 | Kanarik et al. |
| 2006/0130971 A1 | 6/2006 | Chang et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0178008 A1 | 8/2006 | Yeh et al. |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210723 A1 | 9/2006 | Ishizaka |
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0292846 A1 | 12/2006 | Pinto et al. |
| 2007/0022952 A1 | 2/2007 | Ritchie et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0056925 A1 | 3/2007 | Liu et al. |
| 2007/0062453 A1 | 3/2007 | Ishikawa |
| 2007/0071888 A1 | 3/2007 | Shanmugasundram et al. |
| 2007/0072408 A1 | 3/2007 | Enomoto et al. |
| 2007/0079758 A1 | 4/2007 | Holland et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |

(56) References Cited

U.S. PATENT DOCUMENTS

| | | |
|---|---|---|
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0131274 A1 | 6/2007 | Stollwerck et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0287292 A1 | 12/2007 | Li et al. |
| 2008/0017104 A1 | 1/2008 | Matyushkin et al. |
| 2008/0020570 A1 | 1/2008 | Naik |
| 2008/0044990 A1 | 2/2008 | Lee |
| 2008/0050538 A1 | 2/2008 | Hirata |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fisher et al. |
| 2008/0102640 A1 | 5/2008 | Hassan et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142831 A1 | 6/2008 | Su |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0202688 A1 | 8/2008 | Wu et al. |
| 2008/0202892 A1 | 8/2008 | Smith et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0036292 A1 | 2/2009 | Sun et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095621 A1 | 4/2009 | Kao et al. |
| 2009/0098276 A1 | 4/2009 | Burrows et al. |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0120464 A1 | 5/2009 | Rasheed et al. |
| 2009/0162647 A1 | 6/2009 | Sun et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0214825 A1 | 8/2009 | Sun et al. |
| 2009/0223928 A1 | 9/2009 | Colpo |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0317978 A1 | 11/2009 | Higashi |
| 2009/0294898 A1 | 12/2009 | Feustel et al. |
| 2009/0320756 A1 | 12/2009 | Tanaka |
| 2010/0000683 A1 | 1/2010 | Kadkhodayan et al. |
| 2010/0003824 A1 | 1/2010 | Kadkhodayan et al. |
| 2010/0022030 A1 | 1/2010 | Ditizio |
| 2010/0039747 A1 | 2/2010 | Sansoni |
| 2010/0047080 A1 | 2/2010 | Bruce |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher |
| 2010/0081285 A1 | 4/2010 | Chen et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |

(56) References Cited

U.S. PATENT DOCUMENTS

| | | |
|---|---|---|
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207205 A1 | 8/2010 | Grebs et al. |
| 2010/0224324 A1 | 9/2010 | Kasai |
| 2010/0240205 A1 | 9/2010 | Son |
| 2010/0243606 A1 | 9/2010 | Koshimizu |
| 2010/0252068 A1 | 10/2010 | Kannan et al. |
| 2010/0258913 A1 | 10/2010 | Lue |
| 2010/0288369 A1 | 11/2010 | Chang et al. |
| 2010/0294199 A1 | 11/2010 | Tran et al. |
| 2010/0330814 A1 | 12/2010 | Yokota et al. |
| 2011/0005607 A1 | 1/2011 | Desbiolles et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0042799 A1 | 2/2011 | Kim et al. |
| 2011/0045676 A1 | 2/2011 | Park |
| 2011/0048325 A1 | 3/2011 | Choie et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0100489 A1 | 5/2011 | Orito |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0140229 A1 | 6/2011 | Rachmady et al. |
| 2011/0143542 A1 | 6/2011 | Feurprier et al. |
| 2011/0146909 A1 | 6/2011 | Shi et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0256421 A1 | 10/2011 | Bose et al. |
| 2011/0265884 A1 | 11/2011 | Xu et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0304078 A1 | 12/2011 | Lee et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0052683 A1 | 3/2012 | Kim et al. |
| 2012/0068242 A1 | 3/2012 | Shin et al. |
| 2012/0091108 A1 | 4/2012 | Lin et al. |
| 2012/0097330 A1 | 4/2012 | Iyengar et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0180954 A1 | 7/2012 | Yang et al. |
| 2012/0181599 A1 | 7/2012 | Lung |
| 2012/0182808 A1 | 7/2012 | Lue et al. |
| 2012/0196447 A1 | 8/2012 | Yang et al. |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0238102 A1 | 9/2012 | Zhang et al. |
| 2012/0238103 A1 | 9/2012 | Zhang et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0258600 A1 | 10/2012 | Godet et al. |
| 2012/0267346 A1 | 10/2012 | Kao et al. |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0023124 A1 | 1/2013 | Nemani et al. |
| 2013/0026135 A1 | 1/2013 | Kim |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0045605 A1 | 2/2013 | Wang et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0098868 A1 | 4/2013 | Nishimura et al. |
| 2013/0105948 A1 | 5/2013 | Kewley |
| 2013/0115372 A1 | 5/2013 | Pavol et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0150303 A1 | 6/2013 | Kungl et al. |
| 2013/0161726 A1 | 6/2013 | Kim et al. |
| 2013/0171810 A1 | 7/2013 | Sun et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0217243 A1 | 8/2013 | Underwood et al. |
| 2013/0224960 A1 | 8/2013 | Payyapilly et al. |
| 2013/0260533 A1 | 10/2013 | Sapre et al. |

(56) References Cited

U.S. PATENT DOCUMENTS

| | | |
|---|---|---|
| 2013/0260564 A1 | 10/2013 | Sapre et al. |
| 2013/0279066 A1 | 10/2013 | Lubomirsky et al. |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0284374 A1 | 10/2013 | Lubomirsky et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0057447 A1 | 2/2014 | Yang et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0124364 A1 | 5/2014 | Yoo et al. |
| 2014/0134847 A1 | 5/2014 | Seya |
| 2014/0141621 A1 | 5/2014 | Ren et al. |
| 2014/0147126 A1 | 5/2014 | Yamashita et al. |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0186772 A1 | 7/2014 | Pohlers et al. |
| 2014/0190410 A1 | 7/2014 | Kim |
| 2014/0191388 A1 | 7/2014 | Chen |
| 2014/0199851 A1 | 7/2014 | Nemani et al. |
| 2014/0209245 A1 | 7/2014 | Yamamoto et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263272 A1 | 9/2014 | Duan et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0060265 A1 | 3/2015 | Cho et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118858 A1 | 4/2015 | Takaba |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0152072 A1 | 6/2015 | Cantat et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221541 A1 | 8/2015 | Nemani et al. |
| 2015/0235809 A1 | 8/2015 | Ito et al. |
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0294980 A1 | 10/2015 | Lee et al. |
| 2015/0332930 A1 | 11/2015 | Wang et al. |
| 2015/0340225 A1 | 11/2015 | Kim et al. |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0380431 A1 | 12/2015 | Kanamori et al. |
| 2016/0005572 A1 | 1/2016 | Liang et al. |
| 2016/0005833 A1 | 1/2016 | Collins et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042968 A1 | 2/2016 | Purayath et al. |
| 2016/0056167 A1 | 2/2016 | Wang et al. |
| 2016/0064233 A1 | 3/2016 | Wang et al. |
| 2016/0079072 A1 | 3/2016 | Wang et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0104606 A1 | 4/2016 | Park et al. |
| 2016/0109863 A1 | 4/2016 | Valcore et al. |

(56) References Cited

U.S. PATENT DOCUMENTS

| | | |
|---|---|---|
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0172216 A1 | 6/2016 | Marakhtanov et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0196969 A1 | 7/2016 | Berry et al. |
| 2016/0204009 A1 | 7/2016 | Nguyen et al. |
| 2016/0218018 A1 | 7/2016 | Lieu et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0293438 A1 | 10/2016 | Zhou et al. |
| 2016/0300694 A1 | 10/2016 | Yang et al. |
| 2016/0307772 A1 | 10/2016 | Choi et al. |
| 2016/0314961 A1 | 10/2016 | Liu et al. |
| 2016/0314985 A1 | 10/2016 | Yang et al. |
| 2016/0343548 A1 | 11/2016 | Howald et al. |
| 2017/0040175 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0062184 A1 | 3/2017 | Tran et al. |
| 2017/0110290 A1 | 4/2017 | Kobayashi et al. |
| 2017/0110475 A1 | 4/2017 | Liu et al. |
| 2017/0178924 A1 | 6/2017 | Chen et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1 | 8/2017 | Liang et al. |

FOREIGN PATENT DOCUMENTS

| | | |
|---|---|---|
| CN | 101236893 A | 8/2008 |
| CN | 101378850 A | 3/2009 |
| CN | 101410190 A | 4/2009 |
| EP | 1675160 A1 | 6/2006 |
| JP | S59-126778 A | 7/1984 |
| JP | H01-200627 A | 8/1989 |
| JP | H02-114525 A | 4/1990 |
| JP | H07-153739 A | 6/1995 |
| JP | H8-31755 A | 2/1996 |
| JP | H08-107101 A | 4/1996 |
| JP | H08-264510 A | 10/1996 |
| JP | 2001-313282 A | 11/2001 |
| JP | 2002-083869 A | 3/2002 |
| JP | 2003-174020 A | 6/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-180458 | 8/2010 |
| JP | 2011-208436 A | 3/2011 |
| JP | 2011-518408 A | 6/2011 |
| JP | 4763293 B2 | 8/2011 |
| JP | 2011-171378 A | 9/2011 |
| JP | 2012-19164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| KR | 10-2000-008278 A | 2/2000 |
| KR | 2003-0023964 A | 3/2003 |
| KR | 10-2003-0054726 A | 7/2003 |
| KR | 100441297 B1 | 7/2004 |
| KR | 10-2005-0007143 A | 1/2005 |
| KR | 10-2005-0042701 A | 5/2005 |
| KR | 2005-0049903 A | 5/2005 |
| KR | 10-2006-0080509 A | 7/2006 |
| KR | 1006-41762 B1 | 11/2006 |
| KR | 100712727 B1 | 4/2007 |
| KR | 2007-0079870 A | 8/2007 |
| KR | 10-2008-0063988 A | 7/2008 |
| KR | 10-2009-0040869 A | 4/2009 |
| KR | 10-2009-0128913 A | 12/2009 |
| KR | 10-2010-0013980 A | 2/2010 |
| KR | 10-2011-0086540 A | 7/2011 |
| KR | 10-2011-0126675 A | 11/2011 |
| KR | 10-2012-0022251 A | 2/2012 |
| KR | 10-2012-0082640 A | 7/2012 |
| KR | 10-2016-0002543 A | 1/2016 |
| TW | 2007-09256 A | 3/2007 |
| TW | 2007-35196 A | 9/2007 |
| TW | 2011-27983 A1 | 8/2011 |
| TW | 2012-07919 | 2/2012 |
| TW | 2012-13594 A | 4/2012 |
| TW | 2012-33842 A1 | 8/2012 |
| WO | 2008-112673 A2 | 9/2008 |
| WO | 2009-084194 A1 | 7/2009 |
| WO | 2010-010706 | 1/2010 |
| WO | 2011-027515 A | 3/2011 |
| WO | 2011-031556 A | 3/2011 |
| WO | 2011-149638 A | 12/2011 |
| WO | 2012-050321 A | 4/2012 |
| WO | 2012-118987 A1 | 9/2012 |
| WO | 2012-125656 A2 | 9/2012 |

OTHER PUBLICATIONS

H. Xiao, Introduction to Semiconductor Manufacturing Technology, published by Prentice Hall, 2001, ISNB 0-13-022404-9, pp. 354-356.

International Search Report of PCT/US2013/048931 dated Oct. 10, 2013, 9 pages.

International Search Report and Written Opinion of PCT/US2016/045551 dated Nov. 17, 2016, all pages.

International Search Report and Written Opinion of PCT/US2016/045543 dated Nov. 17, 2016, all pages.

J.J. Wang and et al., "Inductively coupled plasma etching of bulk 1-20 6H-SiC and thin-film SiCN in NF3 chemistries," Journal of Vacuum Science & Technology A: Vacuum, Surfaces, and Films 16, 2204 (1998).

"Liang et al. Industrial Application of Plasma Process vol. 3, pp. 61-74, 2010".

Manual No. TQMA72E1. "Bayard-Alpert Pirani Gauge FRG-730: Short Operating Instructions" Mar. 2012. Agilent Technologies, Lexington, MS 02421, USA. pp. 1-45.

OA dated Jun. 8, 2018 in Taiwan Patent Application No. 106134685, all pages.

\* cited by examiner

PEDESTAL WITH MULTI-ZONE TEMPERATURE CONTROL AND MULTIPLE PURGE CAPABILITIES

CROSS-REFERENCES TO RELATED APPLICATIONS

This application is a divisional of U.S. patent application Ser. No. 13/723,516, filed Dec. 21, 2012, and titled "PEDESTAL WITH MULTI-ZONE TEMPERATURE CONTROL AND MULTIPLE PURGE CAPABILITIES" which claims the benefit of U.S. Provisional Application No. 61/673,067, filed Jul. 12, 2012, and titled "PEDESTAL WITH MULTI-ZONE TEMPERATURE CONTROL AND MULTIPLE PURGE CAPABILITIES." The entire contents of both of which are hereby incorporated by reference for all purposes.

TECHNICAL FIELD

The present technology relates to components and apparatuses for semiconductor manufacturing. More specifically, the present technology relates to substrate pedestal assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Temperature fluctuations that may occur across the surface or through the depth of the supporting assembly may create temperature zones or regions across a substrate. These regions of varying temperature may affect processes performed on or to the substrate, which may often reduce the uniformity of deposited films or etched structures along the substrate. Depending on the degree of variation along the surface of the substrate, device failure may occur due to the inconsistencies produced by the applications.

Additionally, the structures housed within a semiconductor processing chamber may be affected by the processes performed within the chamber. For example, materials deposited within the chambers may deposit on the equipment within the chamber as well as on the substrate itself. Thus, for these and other reasons, there is a need for improved equipment and assemblies within semiconductor processing chambers. These and other needs are addressed by the present technology.

SUMMARY

Substrate support assemblies for a semiconductor processing apparatus are described. The assemblies may include a pedestal and a stem coupled with the pedestal. The pedestal may be configured to provide multiple regions having independently controlled temperatures. Each region may include a fluid channel to provide a substantially uniform temperature control within the region, by circulating a temperature controlled fluid that is received from and delivered to internal channels in the stem. The fluid channels may include multiple portions configured in a parallel-reverse flow arrangement. The pedestal may also include fluid purge channels that may be configured to provide thermal isolation between the regions of the pedestal.

The first and second fluid channels may be arranged in a coil pattern within the support assemblies in disclosed embodiments. Additionally, the stem may further include a heating means operable to maintain a temperature of the stem different from the first and second pedestal regions. The first and second fluid channels may be fluidly isolated from one another in order to provide temperature differentiation across the surface. The substrate support surface may additionally be of any number of geometries and may be circular. Within this circular design, the first region of the pedestal may be centrally located, and the second region may be an annular region surrounding the first region. Subsequent regions may additionally be provided.

In disclosed embodiments the pedestal and stem may be two separate components electrically isolated from one another. Additionally, the first and second portions of the first fluid channel may be disposed vertically from one another and may be substantially or directly vertically aligned. The support assemblies may additionally include a first purge channel defined within the pedestal and configured to provide a first purge flow path for a purge gas. The first purge channel may include a vertical isolation cavity defined between the first region and second region of the pedestal, and the isolation cavity may be configured to receive a portion of the purge gas. The pedestal portion of the assemblies may be formed by coupling one or more plates with each other, and the pedestal may comprise multiple plates in various embodiments. A first plate may comprise the substrate support surface, and a second plate may be located below the first plate and have areas defining at least part of the third and fourth portions of the second fluid channel, as well as at least a portion of the isolation cavity.

The pedestal may include at least one additional plate located below the first plate, or between the first and second plates, that includes areas defining the first and second portions of the first fluid channel. The at least one additional plate may further include areas defining at least part of the third and fourth portions of the second fluid channel, at least part of the isolation cavity, as well as the first purge channel. The at least one additional plate may be composed of at least two plates, such as a third and fourth plate. The third plate may be located below the first plate and include areas defining at least part of the first and second portions of the first fluid channel, at least part of the third and fourth portions of the second fluid channel, and a first portion of the isolation cavity. The fourth plate may be positioned below the third plate and include portions defining at least a portion of the first purge channel, as well as at least a second portion of the isolation cavity that is in fluid communication with the first portion of the isolation cavity defined by the third plate. The isolation cavity may be configured to produce a thermal barrier between the first region of the pedestal and the second region of the pedestal. The assemblies may still further include a second purge channel defined along an interface between the stem and the pedestal, and that is configured to provide a second purge flow path that is configured to produce a thermal barrier between the stem and the pedestal. The second purge channel may at least partially be defined by an additional purge distribution plate.

Substrate support assemblies are also described including a pedestal having a substrate support surface. The assemblies may additionally include a stem coupled with the pedestal opposite the substrate support surface that includes a pair of stem internal channels configured to deliver and receive a temperature controlled fluid to the pedestal. The assemblies may include a fluid channel defined within a central region of the pedestal coupled at an inlet section with one of the pair of stem internal channels, and be configured to receive the temperature controlled fluid from the stem internal channel. The fluid channel may further be coupled at an outlet section with the other of the pair of stem internal channels, and be configured to direct the temperature controlled fluid to the other stem internal channel. The fluid channel may include a first channel portion and a second channel portion between the inlet and the outlet sections, and the second channel portion may be disposed vertically from and coupled in parallel-reverse pattern with the first channel portion. The channel portions may be configured such that fluid received at the inlet section is directed through the first channel portion prior to flowing through the second channel portion and through the outlet section. The fluid channel may also be arranged in a coil pattern that is configured to direct the temperature controlled fluid from the inlet section radially outward through the pedestal. The stem of the assembly may further include a heating means separate from the stem internal channels, and be operable to maintain the stem at a temperature different from the pedestal. The first and second portions of the fluid channel may be disposed vertically from one another in disclosed embodiments, and the portions may be in direct vertical alignment. The pedestal may further include a purge channel having a distally located outwardly closed cavity defined within the pedestal at least partially below the fluid channel. The cavity may be located at a position radially outward from the pedestal defining a region of the pedestal. The purge channel may be configured to receive a pressurized fluid from a stem purge channel that is contained within the purge channel to create a fluid barrier within the pedestal throughout the purge channel. Additionally, the pedestal portion of the assemblies may be formed from a plurality of plates coupled with one another to form the pedestal.

Such technology may provide numerous benefits over conventional equipment. For example, temperatures across the pedestal surface may be maintained at more uniform temperatures, which may allow for improved processes across the surface of a substrate being processed. Additionally, providing an assembly capable of having different regions maintained at different temperatures may allow more precise operations to be performed, and may reduce the amount of material disposed on equipment surfaces. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

The present technology includes improved pedestal designs for heating and cooling distribution during semiconductor processing operations. While conventional pedestals may control the general temperature of the substrate during operations, the presently described technology allows for improved control of the temperature characteristics across the entirety of the surface and exterior of the pedestal and stem. The technology allows for the pedestal to be controlled in multiple independent zones. In so doing, improved operations may be performed because a substrate residing on the pedestal can be maintained at a more uniform temperature profile across the entire surface. These and other benefits will be explained in detail below.

Figure 1:
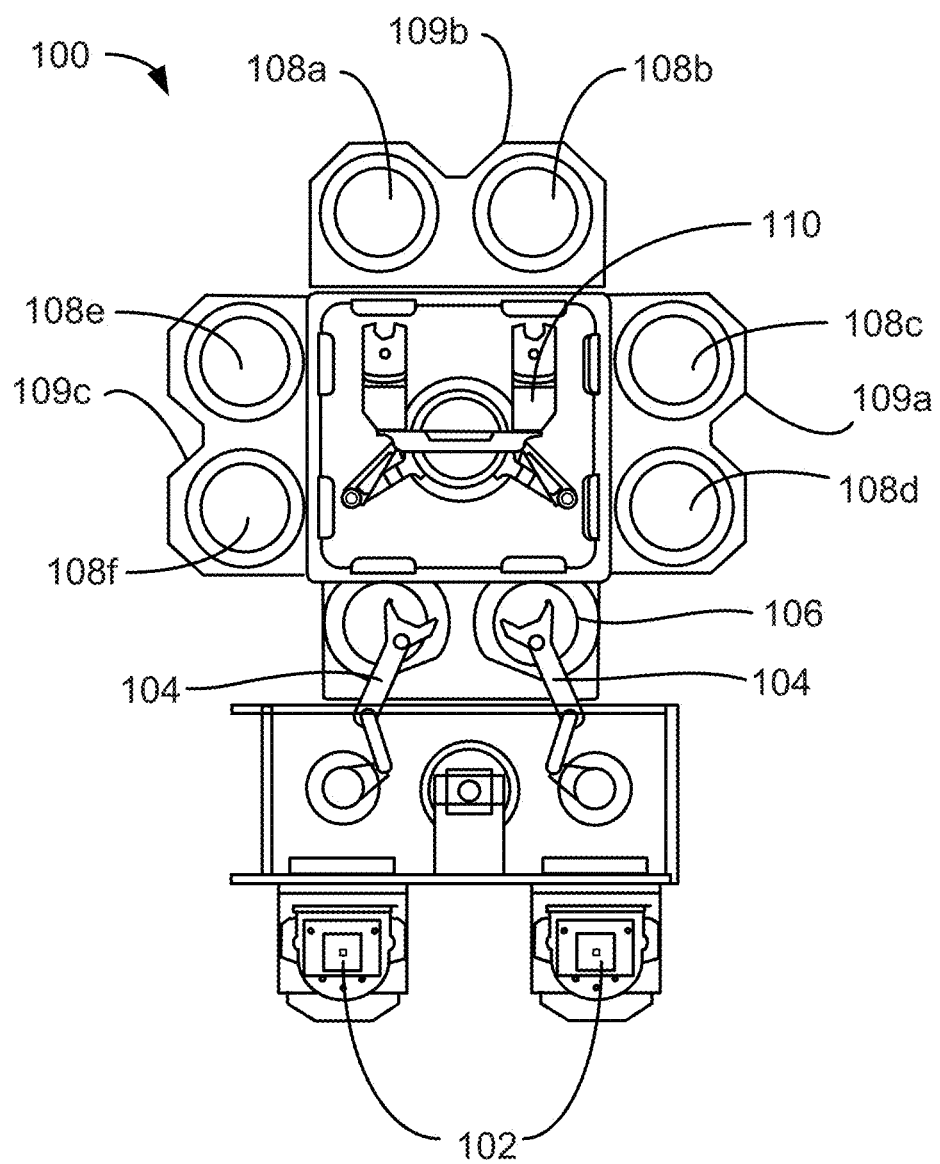
FIG. 1 is a top plan view of one embodiment of a processing tool.

FIG. 1 is a top plan view of one embodiment of a processing tool 100 used in exemplary semiconductor manufacturing processes, and in which a pedestal according to the present technology may be found. In the figure, a pair of FOUPs (front opening unified pods) 102 supply substrates of a variety of dimensions that may be received by robotic arms 104 and placed into a low pressure holding area 106 before being placed into one of the substrate processing sections 108a-f of the tandem process chambers 109a-c. A second robotic arm 110 may be used to transport the substrates from the holding area 106 to the processing chambers 108a-f and back.

The substrate processing sections 108a-f of the tandem process chambers 109a-c may include one or more system components for depositing, annealing, curing and/or etching films on a substrate. In one configuration, two pairs of the tandem processing sections of the processing chamber (e.g., 108c-d and 108e-f) may be used to deposit a flowable dielectric material on the substrate, and the third pair of tandem processing sections (e.g., 108a-b) may be used to anneal the deposited dielectric. In another configuration, the two pairs of the tandem processing sections of processing chambers (e.g., 108c-d and 108e-f) may be configured to both deposit and anneal a flowable dielectric film on the substrate, while the third pair of tandem processing sections (e.g., 108a-b) may be used for UV or E-beam curing of the deposited film. In still another configuration, all three pairs of tandem processing sections (e.g., 108a-f) may be configured to etch dielectric films deposited on the substrate.

In yet another configuration, two pairs of tandem processing sections (e.g., 108c-d and 108e-f) may be used for both deposition and UV or E-beam curing of the dielectric, while a third pair of tandem processing sections (e.g. 108a- b) may be used for annealing the dielectric film. It will be appreciated that additional configurations of deposition, annealing, and curing chambers for flowable dielectric films are contemplated by system 100.

In addition, one or more of the tandem processing sections 108a-f may be configured as a wet treatment chamber. These process chambers may include heating the dielectric film in an atmosphere that includes moisture. Thus, embodiments of system 100 may include wet treatment tandem processing sections 108a-b and anneal tandem processing sections 108c-d to perform both wet and dry anneals on the deposited dielectric film.

Figure 2:
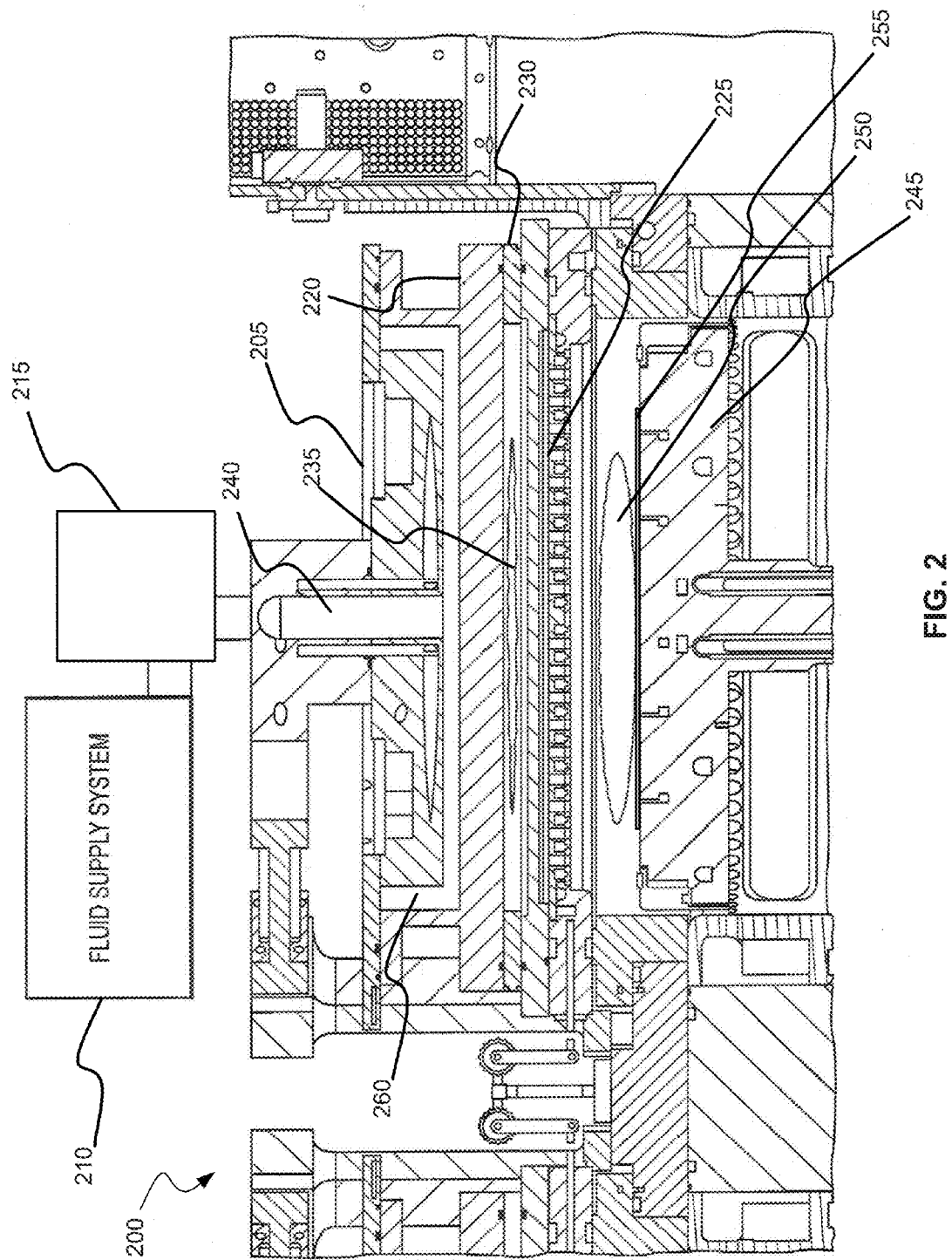
FIG. 2 is a schematic cross-sectional view of one embodiment of a processing chamber in which a pedestal according to the disclosed technology may be found.

FIG. 2 shows a simplified cross-sectional view of a processing system 200 according to embodiments of the present technology that may include partitioned plasma generation regions within the processing chamber. The processing system may optionally include components located outside the processing chamber 205, such as fluid supply system 210. The processing chamber 205 may hold an internal pressure different than the surrounding pressure. For example, the pressure inside the processing chamber may be about 10 mTorr to about 20 Torr during processing.

During operation, a process gas may be flowed into the first plasma region 235 through a gas inlet assembly 240. The process gas may be excited prior to entering the first plasma region 235 within a remote plasma system (RPS) 215. A lid 220, a showerhead 225, and a substrate support 245, having a substrate 255 disposed thereon, are shown according to disclosed embodiments. The lid 220 may be pyramidal, conical, or of another similar structure with a narrow top portion expanding to a wide bottom portion, or may be relatively flat as depicted. The lid 220 may include an applied AC voltage source and the showerhead 225 may be grounded, consistent with plasma generation in the first plasma region 235. An insulating ring 230 may be positioned between the lid 220 and the showerhead 225 enabling a capacitively coupled plasma (CCP) to be formed in the first plasma region 235.

The lid 220 may be a dual-source lid for use with a processing chamber according to disclosed embodiments. A fluid inlet assembly 240 may introduce a fluid, such as a gas, into the first plasma region 235. The fluid inlet assembly 240 may include two distinct fluid supply channels within the assembly. A first channel may carry a fluid, such as a gas, that passes through the RPS 215, while a second channel may carry a fluid, such as a gas, that bypasses the RPS 215. The first channel may be used for the process gas and the second channel may be used for a treatment gas in disclosed embodiments. The gases may flow into the plasma region 235 and be dispersed by a baffle (not shown). The lid 220 and showerhead 225 are shown with an insulating ring 230 in between, which allows an AC potential to be applied to the lid 220 relative to the showerhead 225.

A fluid, such as a precursor, may be flowed into the second plasma region 250 by embodiments of the showerhead 225 described herein. Excited species derived from the process gas in the plasma region 235 may travel through apertures in the showerhead 225 and react with the precursor flowing into the second plasma region 250 from the showerhead. Little or no plasma may be present in the second plasma region 250. Excited derivatives of the process gas and the precursor may combine in the region above the substrate.

Exciting the process gas in the first plasma region 235 directly, exciting the process gas in the RPS 215, or both, may provide several benefits. The concentration of the excited species derived from the process gas may be increased within the second plasma region 250 due to the plasma in the first plasma region 235. This increase may result from the location of the plasma in the first plasma region 235. The second plasma region 250 may be located closer to the first plasma region 235 than the RPS 215, leaving less time for the excited species to leave excited states through collisions with other gas molecules, walls of the chamber, and surfaces of the showerhead.

The uniformity of the concentration of the excited species derived from the process gas may also be increased within the second plasma region 250. This may result from the shape of the first plasma region 235, which may be more similar to the shape of the second plasma region 250. Excited species created in the RPS 215 may travel greater distances in order to pass through apertures near the edges of the showerhead 225 relative to species that pass through apertures near the center of the showerhead 225. The greater distance may result in a reduced excitation of the excited species and, for example, may result in a slower growth rate near the edge of a substrate. Exciting the process gas in the first plasma region 235 may mitigate this variation.

The processing gas may be excited in the RPS 215 and may be passed through the showerhead 225 to the second plasma region 250 in the excited state. Alternatively, power may be applied to the first processing region to either excite a plasma gas or enhance an already excited process gas from the RPS 215. While a plasma may be generated in the second plasma region 250, a plasma may alternatively not be generated in the second plasma region. In one example, the only excitation of the processing gas or precursors may be from exciting the processing gas in the RPS 215 to react with the precursors in the second plasma region 250.

The plasma generating gases and/or plasma excited species may pass through a plurality of holes (not shown) in lid 220 for a more uniform delivery into the plasma excitation region 235. Exemplary configurations include having the inlet 240 open into a gas supply region 260 partitioned from the plasma excitation region 235 by lid 220 so that the gases/species flow through the holes in the lid 220 into the plasma excitation region 235. Structural and operational features may be selected to prevent significant backflow of plasma from the plasma excitation region 235 back into the supply region 260, inlet 240, and fluid supply system 210. The structural features may include the selection of dimensions and cross-sectional geometry of the holes in lid 220 that deactivates back-streaming plasma. The operational features may include maintaining a pressure difference between the gas supply region 260 and plasma excitation region 235 that maintains a unidirectional flow of plasma through the showerhead 225.

The showerhead 225 may include a plurality of holes that suppress the migration of ionically-charged species out of the plasma excitation region 235 while allowing uncharged neutral or radical species to pass through the showerhead 225. These uncharged species may include highly reactive species that are transported with less reactive carrier gas through the holes. As noted above, the migration of ionic species through the holes may be reduced, and in some instances completely suppressed. Controlling the amount of ionic species passing through the showerhead 225 may provide increased control over the gas mixture brought into contact with the underlying wafer substrate, which in turn increases control of the deposition and/or etch characteristics of the gas mixture.

The plurality of holes in the showerhead 225 may be configured to control the passage of the activated gas (i.e., the ionic, radical, and/or neutral species) through the showerhead 225. For example, the aspect ratio of the holes (i.e., the hole diameter to length) and/or the geometry of the holes may be controlled so that the flow of ionically-charged species in the activated gas passing through the showerhead 225 is reduced. In embodiments where the showerhead 225 includes an electrically coupled ion suppressor with the showerhead, the holes in the ion blocker, which may be disposed above the showerhead, may include a tapered portion that faces the plasma excitation region 235, and a cylindrical portion that faces the showerhead. The cylindrical portion may be shaped and dimensioned to control the flow of ionic species passing to the showerhead. An adjustable electrical bias may also be applied to the showerhead 225 as an additional means to control the flow of ionic species.

Depending on whether a deposition or an etching process is performed, gases and plasma excited species may pass through the showerhead 225 and be directed to the substrate. The showerhead can further direct the flow of gases or plasma species. The showerhead may be a dual-zone showerhead that may include multiple fluid channels for directing the flow of one or more gases. The dual-zone showerhead may have a first set of channels to permit the passage of plasma excited species into reaction region 250, and a second set of channels that deliver a second gas/precursor mixture into the reaction region 250.

A fluid delivery source may be coupled with the showerhead to deliver a precursor that is able to bypass plasma excitation region 235 and enter reaction region 260 from within the showerhead through the second set of channels. The second set of channels in the showerhead may be fluidly coupled with a source gas/precursor mixture (not shown) that is selected for the process to be performed. For example, when the processing system is configured to perform an etch on the substrate surface, the source gas/precursor mixture may include etchants such as oxidants, halogens, water vapor and/or carrier gases that mix in the reaction region 250 with plasma excited species distributed from the first set of channels in the showerhead. Excessive ions in the plasma excited species may be reduced as the species move through the holes in the showerhead 225, and reduced further as the species move through channels in the showerhead.

The pedestal 245 may be operable to support and move the substrate or wafer 255. The distance between the pedestal 245 and the bottom of the showerhead 225 help define the reaction region 250. The pedestal 245 may be vertically or axially adjustable within the processing chamber 205 to increase or decrease the reaction region 250 and affect the deposition or etching of the wafer substrate by repositioning the wafer substrate with respect to the gases passed through the showerhead 225.

The pedestal 245 may also be configured with a heating element such as a resistive heating element to maintain the substrate at heating temperatures (e.g., about 90° C. to about 1100° C.). Exemplary heating elements may include a single-loop heater element embedded in the substrate support platter that makes two or more full turns in the form of parallel concentric circles. An outer portion of the heater element may run adjacent to a perimeter of the support platten, while an inner portion may run on the path of a concentric circle having a smaller radius. The wiring to the heater element may pass through the stem of the pedestal.

A dual-zone showerhead, as well as the processing system and chamber, are more fully described in patent application Ser. No. 13/251,714 filed on Oct. 3, 2011, which is hereby incorporated by reference for all purposes to the extent not inconsistent with the claimed features and description herein.

Figure 3:
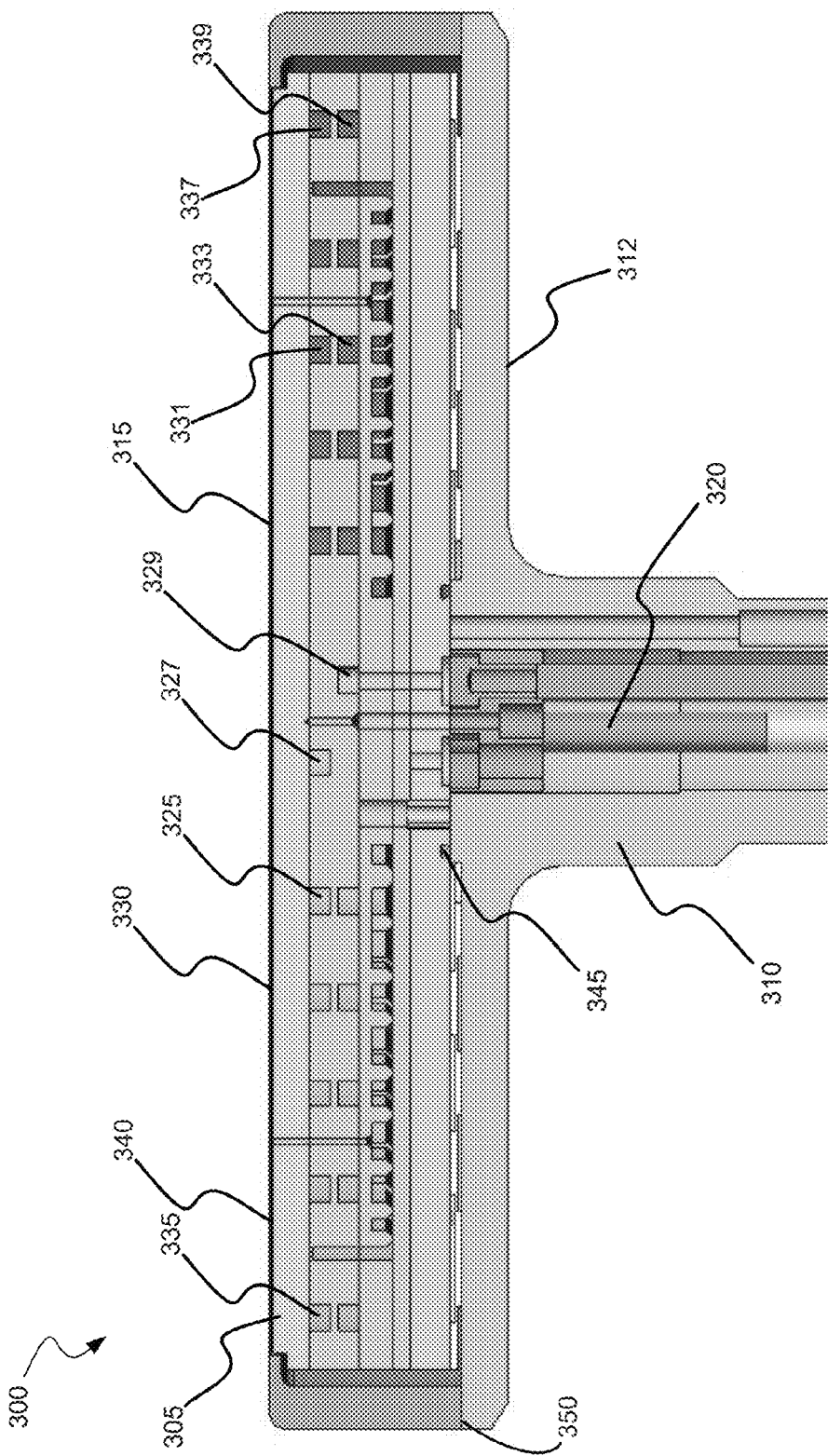
FIG. 3 illustrates a cross-sectional view of a substrate support assembly according to embodiments of the present technology.

Turning to FIG. 3, a cross-sectional view of a substrate support assembly 300 according to embodiments of the present technology is illustrated. The support assembly 300 includes a pedestal 305 and stem 310. The stem 310 may also include a base 312 upon which the pedestal 305 is located. The pedestal 305 may include a substrate support surface 315 that is configured to support a substrate during a semiconductor processing operation. The substrate support surface 315 may be made from a metal, such as aluminum, or a ceramic or other material, and may be treated or coated with other materials that provide improved corrosion resistance, improved contact with the substrate, etc.

The stem 310 may be attached to the pedestal 305 opposite the substrate support surface 315. The stem 310 may include one or more internal channels 320 configured to deliver and receive temperature controlled fluids, pressurized fluids, or gases to and from the pedestal 305. An exemplary stem 310 may include four internal channels 320 that may be divided into pairs. Alternative arrangements may include more or less channels, and may include 1, 2, 3, 4, 5, 6, 7, 8, 10, 12, etc., or more channels for fluid delivery. A first pair of internal channels 320 may be configured to deliver and receive, respectively through the channels, a first temperature controlled fluid to the pedestal 305. A second pair of internal channels 320 may be configured to deliver and receive, respectively through the channels, a second temperature controlled fluid to the pedestal 305. The stem may also include one or more heating means operable to maintain a temperature of the stem different from the temperatures maintained in the pedestal. For example, the stem may include a fluid circulation system jacketed around, or integrated within, the stem. Alternatively, the stem 310 may also be configured with a heating element such as a resistive heating element to maintain the stem at a particular temperature (e.g., about 90° C. to about 1100° C.). The wiring to the heater element may pass through the stem of the pedestal or be otherwise directed through the chamber. By maintaining the stem at a suitable temperature, it may be possible to limit or prevent deposition on the stem portion of the support assembly 300.

The first and second temperature controlled fluids may be delivered to the same or different regions of the pedestal through fluid channels located in the pedestal 305. For example, the first temperature controlled fluid may be delivered to a first fluid channel 325 within a first region 330 of the pedestal 305. The second temperature controlled fluid may be delivered to a second fluid channel 335 within a second region 340 of the pedestal 305. The two fluids may be the same or different fluids, and may be provided at the same or different temperatures in order to maintain the two regions 330, 340 at similar or different temperatures. For example, the second temperature controlled fluid may be delivered at a temperature greater than or less than the first temperature controlled fluid, which will allow the second region 340 to be at a higher or lower, respectively, temperature than the first region 330. This can be used to affect etching and deposition profiles across a wafer, and can also be used to affect how much deposition or etching occurs at different locations. Circulation of the temperature controlled fluids allows the substrate temperature to be maintained at relatively low temperatures, e.g., about −20° C. to about 150° C., as well as at much higher temperatures, e.g., about 90° C. to about 1100° C. The temperatures may alternatively be maintained at between about 0° C. and 100° C., less than or about 100° C., etc. Exemplary heat exchange fluids include ethylene glycol and water, but other fluids may be utilized. In alternative assemblies 300, a resistive heating element is disposed within the channels to provide heating energy for heating a substrate. In still another alternative, the fluid channels are configured to include both a resistive heating element as well as space for circulation of a temperature controlled fluid such that multiple options of temperature control may be afforded.

Each of the first and second fluid channels may be coupled with the stem internal channels 320 at both an inlet and an outlet for receiving and delivering the temperature controlled fluids. The temperature controlled fluids may then be circulated through the fluid channels to provide a substantially uniform temperature control in the pedestal regions. In some embodiments, the first and second fluid channels are fluidly isolated from one another. The fluid channels may be arranged in a variety of patterns including spiral, coil, or other geometric patterns that will circulate the temperature controlled fluids through the pedestal regions.

The fluid channel circulation may be similar between the first and second region, and will be explained herein with regard to the first region 330. The first fluid channel 325 may be coupled with one of a first pair of stem internal channels 320 at a first inlet 327 to receive the first temperature controlled fluid. The first fluid channel 325 may be coupled with the other of the first pair of stem internal channels 320 at a first outlet 329 to deliver the first temperature controlled fluid after it has been circulated through the first region 330 of the pedestal 305. The first fluid channel 325 may include a first portion 331 and a second portion 333 between the inlet 327 and outlet 329. The second portion 333 may be disposed vertically from the first portion 331, and in alternative embodiments may be located above or below the first portion 331. In alternative arrangements, the second portion 333 may be disposed horizontally from the first portion 331. The first and second portions may also be disposed in an exact vertical arrangement with each other, with the first portion 331 disposed directly above the second portion 333, for example. Alternatively, the second portion 333 may be displaced from a directly vertical relationship to either side.

The arrangement of the first and second portions of the first fluid channel may be such as to create one of a variety of flow patterns for the first temperature controlled fluid. In one embodiment, the first and second portion are arranged to produce a parallel-reverse flow pattern for the first temperature controlled fluid. Specifically, the temperature controlled fluid, after being received at the first inlet 327, may flow through the first portion of first fluid channel from a location proximate to the stem internal channels outwardly to a distal portion of the first region 330. The temperature controlled fluid may then be transferred between the first and second portions of the first fluid channel and flow from a distal portion of the first region 330 inwardly to a location proximate to the stem internal channels. The temperature controlled fluid may then be delivered to the stem internal channels 320 at the first outlet 329.

Providing a parallel-reverse flow arrangement where the two channels are in close proximity may provide improved temperature control by producing a more uniform temperature profile across the substrate support surface. For example, when the channels are in direct vertical alignment as shown, general areas of fluid flow may average to a uniform temperature. As fluid is flowed through the channels, heat may be dissipated or absorbed, depending on the temperature of the fluid. As the temperature of the fluid changes, the temperature of the pedestal may not remain uniform at all locations. However, when a parallel-reverse flow arrangement of vertically aligned channels is provided, fluid temperature averaging may occur. For example, when the fluid is used for cooling, the point of entry may have the lowest fluid temperature, and the point of exit may have the highest fluid temperature. Accordingly, because these portions of the channel may be in close proximity, the fluid may provide a particular temperature within that region. At a distal portion of the region, the fluid may be at a temperature between the fluid temperatures at the inlet and outlet, and as the fluid reverses flow at the distal area, the particular temperature within that region may be similar to the averaged temperature near the stem. Accordingly, a more uniform temperature profile across the pedestal may be provided based on the fluid rate of flow and the channel orientation, which may not be available in conventional designs.

Although several of the components of the second fluid channel 335, including the inlet and outlet, are not shown in FIG. 3 for the sake of clarity, the second fluid channel 335 may be arranged in the second region 340 in a similar fashion. For example, the second fluid channel 335 may be configured to provide substantially uniform temperature control within the second region 340 of the pedestal 305. The second fluid channel 335 may be coupled with a second inlet to receive the second temperature controlled fluid from one of a second pair of stem internal channels 320, and coupled with a second outlet to deliver the second temperature controlled fluid to the other of the second pair of stem internal channels 320. The second fluid channel may include a third portion 337, and a fourth portion 339, where the third portion 337 is disposed vertically from and arranged in a parallel-reverse pattern with the fourth position 339. In this way, the fluid received at the second inlet may be circulated through the third portion 337 prior to flowing through the fourth portion 339, and then through the second outlet. The circulation of fluid, and the arrangement of the channel, may be similar to that of the first fluid channel, or may be one of the alternative arrangements discussed above. As with the first fluid channel, the third and fourth portions of the second fluid channel may be disposed vertically from one another, or in an alternative configuration. The third and fourth portions may also be disposed in an exact vertical arrangement with each other, with the third portion 337 disposed directly above the fourth portion 339, for example. Alternatively, the fourth portion 339 may be displaced from a directly vertical relationship to either side. In yet another alternative, the fourth portion 339 may be disposed above the third portion 337 of the second fluid channel 335, or the direction of flow may be reversed. Although FIG. 3 shows a single loop for the second fluid channel, any number of loops may be provided based on the channel orientation and dimensions as well as the pedestal dimensions. As with the first fluid channel, the second fluid channel may include any number of connected or spiraled rings around the region, and may in different embodiments include one or more rings and up to or greater than 3, 4, 5, 6, 7, 8, 9, 10, etc. or more loops of the channel.

The substrate support surface 315 may be of a variety of shapes including circular, elliptical, or other geometric shapes. One exemplary pedestal of the technology is substantially circular, with the first region 330 centrally located on the pedestal, and the second region 340 being of an annular shape and surrounding the first region. Each region may also be of a similar or different outer shape than the other. Additional regions may similarly be developed as portions of a region with separate fluid channels, or additional annular sections disposed radially outward from one another.

The pedestal 305 and stem 310 may be isolated from one another on the assembly 300. For example, at contact points 345 and 350, additional material may be disposed that allows the pedestal 305 and stem 310 to be electrically and/or thermally isolated from one another. At a first contact position 345, an o-ring, ceramic ring, or other insulative material may be positioned between the pedestal 305 and stem 310 so that the two portions of the assembly 300 are not in direct, or are in limited, physical contact. Similarly, at contact position 350 an o-ring, ceramic ring, or other insulative material may be positioned between the pedestal 305 and stem 310. One benefit to this arrangement, is that the stem may be maintained at a temperature that is significantly higher, for example, than the pedestal such that the substrate may be kept at a relatively low temperature during a deposition operation, but the stem may be kept at a higher temperature that limits deposition on the surface of the assembly 300. By providing thermal isolation between the sections, the temperature of the stem may not impact or may minimally impact the temperature of the substrate at any location. Additionally, the material utilized at contact position 350 may be a material that is electrically insulative, but may provide conductive heat transfer such that the edge of pedestal 305 may be heated similar to the stem 310, but is electrically isolated from the stem.

The substrate support surface 315 may be one component plate of the pedestal assembly 320, which may include a plurality of plates bonded, welded, fused, or otherwise coupled with each other. In an exemplary embodiment, the pedestal assembly 320 includes five plates, and in alternative embodiments, the pedestal assembly includes less than five plates, more than five plates, at least three plates, etc. The substrate support surface 315 may be the first plate of the assembly. The pedestal assembly 320 may include a second plate which at least partially defines the fluid channels. The plate arrangement and configuration is described further below.

Figure 4:
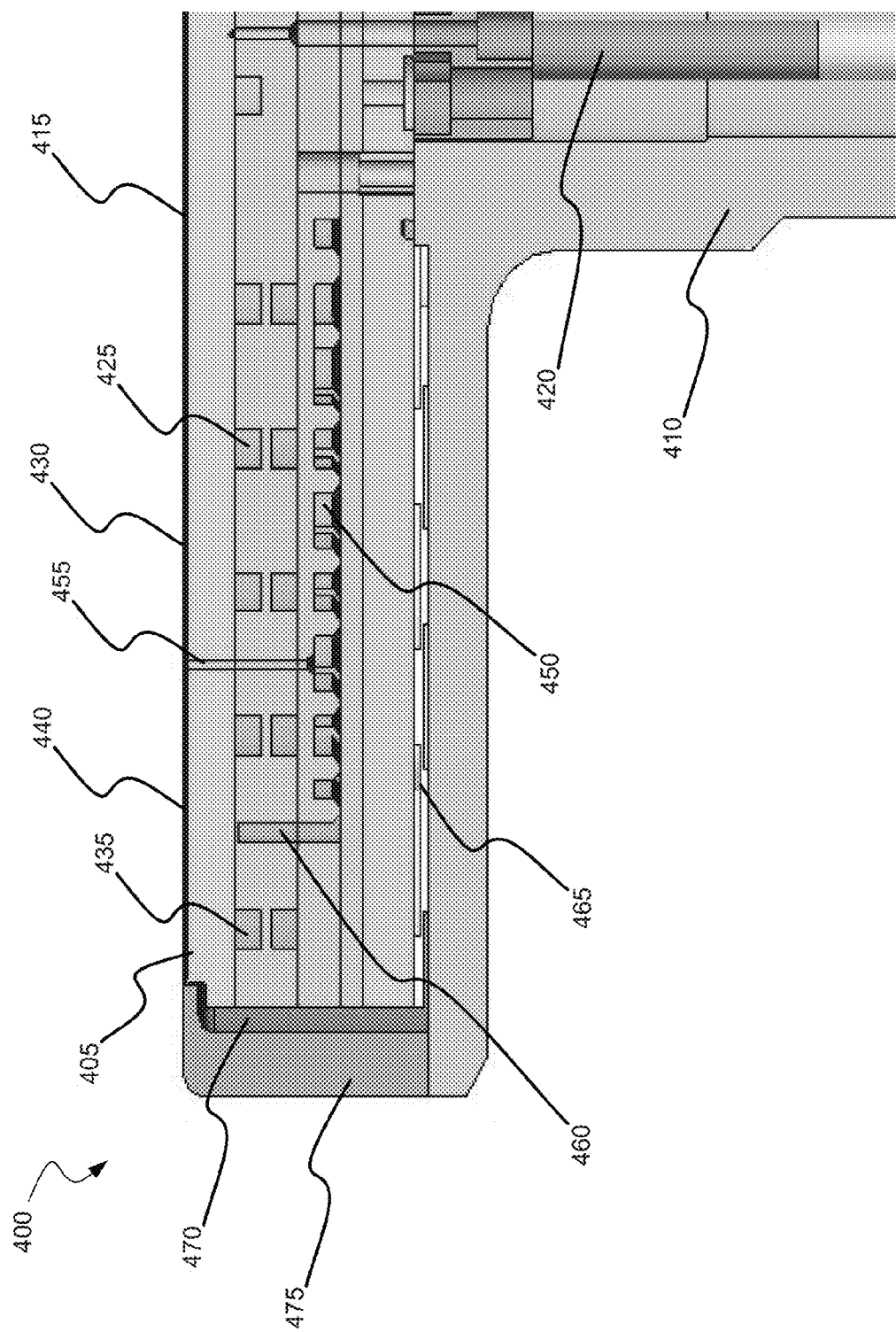
FIG. 4 shows a partial cross-sectional view of a substrate support assembly according to embodiments of the present technology.

FIG. 4 shows a partial cross-sectional view of a substrate support assembly 400 according to embodiments of the present technology. The assembly 400 may include similar components as described above with regard to FIG. 3. As shown, assembly 400 includes pedestal 405 and stem 410. The pedestal may include a substrate support surface 415 as previously discussed. The pedestal 405 may include multiple regions, which may include, for example, a first region 430 and a second region 440. Each region may include fluid channels that circulate a temperature controlled fluid configured to heat or cool the pedestal 405 to a predetermined temperature. The channels may alternatively, or additionally, include heating elements that may allow for resistive heating to be provided through the channels for further adjustment of the pedestal 405 temperature. The first region 430 may include a first channel 425, and the second region 440 may include a second channel 435. As discussed previously, the first and second channels may be fluidly isolated such that a different temperature controlled fluid may be circulated through each of the first and second regions. In one example, the second region may be maintained at about 100° C., while the first region may be maintained at about 50° C., or vice versa. Any particular temperature in the ranges previously described can be maintained separately in either of the first or second regions. In this way, multiple temperature arrangements may be utilized with each region being maintained at the same or a different temperature than the other region.

The pedestal 405 may also include one or more purge channels defined within the pedestal, and configured to provide purge flow paths. For example, a first purge flow path 450 may be defined by a portion of the pedestal 405. An exemplary pedestal 405 may include a plurality of bonded plates, which may include a plate defining the first purge flow path 450. The first purge flow path 450 may circulate a purge fluid throughout the pedestal that is evacuated through a plurality of purge outlets 455 defined in the pedestal 405. Although FIG. 4 illustrates one purge outlet 455, any number of purge outlets may be included in different configurations, and may be included in one or more rings of outlets within the pedestal. This feature will be discussed in more detail with reference to FIG. 5 below.

The first purge path 450 may be configured in any number of patterns within the pedestal 405. For example, the first purge path 450 may be configured in a coil pattern throughout the pedestal 405 in order to provide thermal isolation between the substrate support surface 415 and the stem 410 that may be heated as described above. Alternatively, a plurality of straight channels may be formed in the pedestal that direct a purge fluid directly to the purge outlets 455. Many different variations may be provided with the first purge channel 450, and may be arranged to provide a uniform purge flow across the pedestal. A purge fluid may be delivered from internal channels 420 in the stem 410, through the first purge channel 450, and out through purge outlets 455. The purge fluid may be a gas, including an inert gas, which is utilized to limit or prevent the formation of process byproducts within holes or channels of the substrate support surface 405. When deposition and/or etch processes are performed, byproducts of the process will routinely condense on areas within the substrate processing chamber, including on the substrate support assembly. When these byproducts accumulate on and within the substrate support surface 415, a subsequent substrate positioned on the surface may tilt, which can result in non-uniform deposition or etching. A purge gas delivered through the pedestal may be capable of dislodging and removing reactants from the substrate support surface.

The first purge channel 450 may additionally include a vertical isolation cavity 460 at a distal portion of the first purge channel 450. The vertical isolation cavity may be located at the periphery of the first region 430, and may be configured to receive a portion of the purge gas flow through the first purge channel 450, where the portion of purge gas is maintained in the isolation cavity 460 to provide thermal isolation between the first region 430 and the second region 440. In some arrangements, multiple purge channels are included to separately deliver gas to the isolation cavity 460 and the purge outlets 455. The channel or channels coupled with the isolation cavity 460 may be outwardly closed, such that the channel may be pressurized with fluid. A pressurized gas or pressurized fluid may be delivered to the isolation cavity, or pressurized within the cavity to provide a barrier or temperature curtain at the location of the isolation cavity. The isolation cavity 460 may be arranged as a channel that may separate the first and second regions 430, 440 around the entire pedestal. The purge gas or fluid may be heated or cooled to be delivered to the isolation cavity 460 such that it does not affect the temperature control of the temperature controlled fluids being circulated in the pedestal regions. Alternatively, the purge gas may be delivered at a temperature selected to adjust the temperature profile across the pedestal. In an exemplary pedestal, the isolation cavity 460 may be distributed across multiple plates of the pedestal. For example, the substrate support surface may be a first plate in the pedestal, and the first and second fluid channels 425, 435 may be at least partially defined in the second plate of the pedestal. The second plate may also at least partially define a first portion of the isolation cavity 460. The third plate may at least partially define the first purge channel 450 as well as a second portion of the isolation cavity 460 that is in fluid communication with the first portion of the isolation cavity defined by the second plate. In this way, the isolation cavity 460 may be utilized by delivering a portion of the purge gas to the cavity that may create a thermal barrier between the first and second fluid channels 425, 435, and between the first region 430 and the second region 440 of the pedestal 405.

The pedestal 405 may also include a second purge channel 465 that may be defined along an interface between the stem 410 and the pedestal 405. The second purge channel 465 may be configured to provide a second purge flow path for a purge gas that may produce an additional thermal barrier between the stem 410 and the pedestal 405. Accordingly, in one example, heat applied to the stem 410 to limit the amount of deposition of process byproducts may not affect the temperature control scheme applied through the pedestal 405. The second purge channel 465 may additionally include a second isolation cavity and purge outlet 470. The second isolation cavity and purge outlet 470 may be configured to receive a portion of purge gas delivered through the second purge channel 465, and may provide additional thermal isolation between the edge of the pedestal 475, and the second region 440 of the pedestal 405. Accordingly, the edge of the pedestal 475 may be heated in a fashion similar to the stem 410 in order to reduce the amount of byproduct deposition on the equipment, while providing a barrier to the pedestal 405 such that a uniform temperature profile may be more readily provided on the substrate support surface 415 in the second region 440.

The second isolation cavity 470 may function and be arranged in a similar fashion as the first isolation cavity 460. Purge gas or fluid may be delivered from internal channels 420 in the stem 410, and may be the same or different internal channels 420 as those delivering purge gas to the first purge channel 450. The purge gas delivered to the first and second purge channels 450, 465 may be the same or different in alternative embodiments. The purge gas may be delivered through the second purge channel 465 and into the second isolation cavity 470, prior to being expelled through the purge outlet at the top of the isolation cavity 470. The purge outlet at the top of isolation cavity 470 may be similar to the outlets 455 through which the first purge gas is delivered. Alternatively, a space may be created around the entirety of the top of the second isolation cavity 470 for the flow of purge gas. Alternatively, second isolation cavity 470 may be outwardly closed such that fluid buildup or pressurization may be performed in the second isolation cavity providing an enhanced thermal barrier at the external edge of the pedestal.

Figure 5:
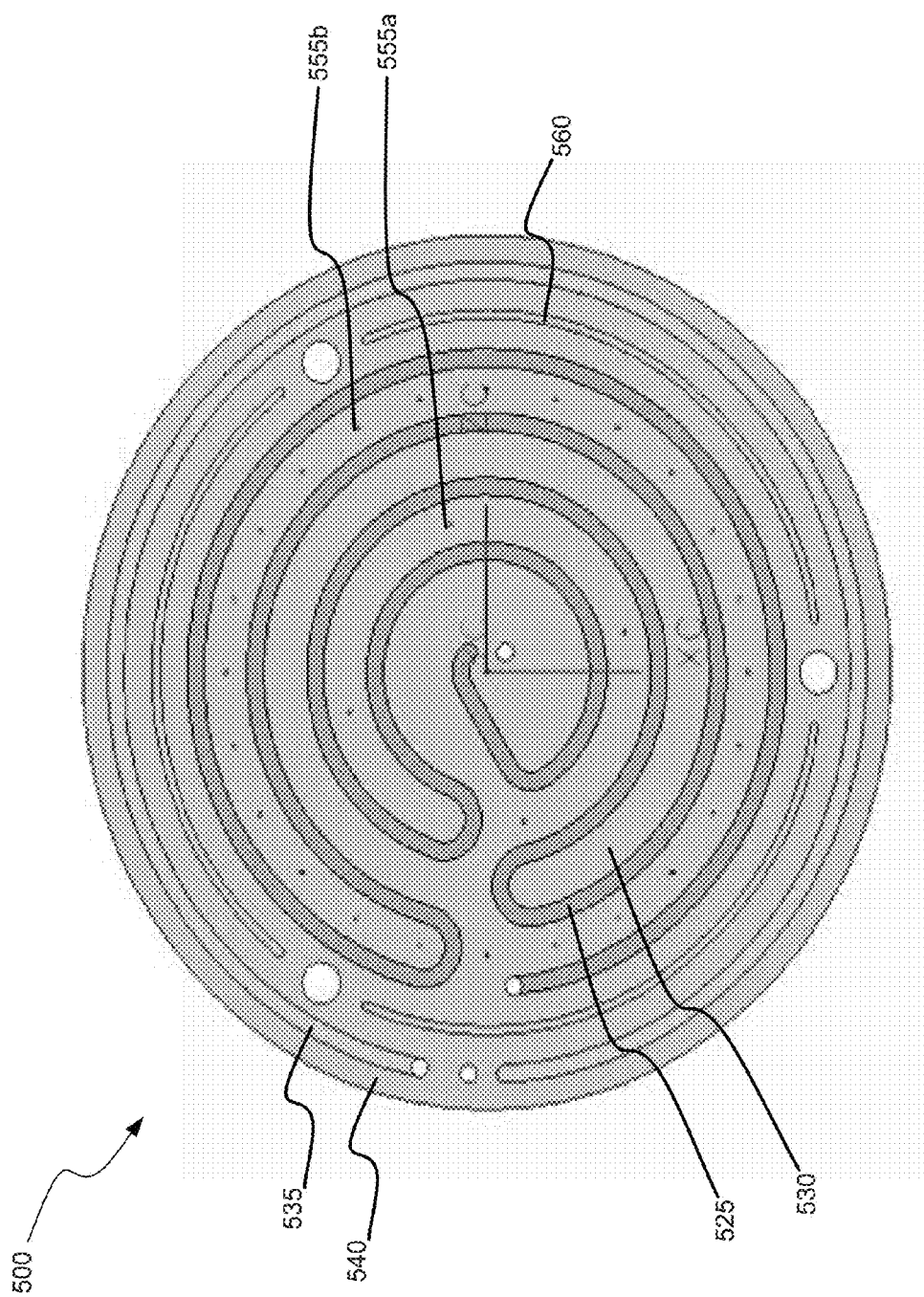
FIG. 5 illustrates a top plan view of a component plate of a pedestal according to embodiments of the present technology.

FIG. 5 illustrates a top plan view of a component plate 500 of a pedestal according to embodiments of the present technology. Plate 500 may be one of several component plates forming the pedestal. Plate 500 includes a first fluid channel 525 disposed within a first region 530, as well as a second fluid channel 535 disposed within a second region 540. The first fluid channel is arranged in a coil pattern, but can alternatively be arranged in a spiral, or other geometric pattern for circulation of a temperature controlled fluid. FIG. 5 illustrates a first portion of the channels, i.e., a top portion, but the plate may additionally define a second portion of the channels underneath. The top and bottom portions may be mirror images of one another, or may be a reverse pattern. In one exemplary plate 500, a temperature controlled fluid is delivered through the center of the plate to the first fluid channel 525 and delivered outwardly toward a distal position in the first fluid channel 525. The temperature controlled fluid may then be transferred to the bottom portion of the fluid channel (not shown) where it is circulated in a parallel-reverse pattern in comparison to the top portion of the fluid channel 525 back toward the center of the plate. The receiving and delivering of the temperature controlled fluid to the first fluid channel may occur through connections with internal channels of the stem of the support assembly.

Plate 500 also includes second fluid channel 535 arranged in a coil around the second region 540 of the plate 500, for circulation of a temperature controlled fluid that may be the same or different than the temperature controlled fluid delivered through the first fluid channel 525. Although shown in a single pass arrangement multiple passes or coil configurations may be utilized depending on the size of the plate 500. Second fluid channel 535 may also include a second portion on the underside of the plate (not shown), to provide a parallel-reverse circulation arrangement of a second temperature controlled fluid.

Plate 500 also may include an isolation cavity 560 that can be utilized to produce a thermal barrier between the first region 530 and the second region 540 of the plate 500. The isolation cavity may be configured to receive a purge fluid that may fill the isolation cavity 560. The cavity 560 may be arranged in a single channel, or in multiple channels as shown in FIG. 5. When assemblies including multiple regions are utilized, the pattern of the fluid channel may affect the ability to include multiple regions. For example, by providing a coiled pattern such as shown in FIG. 5 for first fluid channel 525, an area is provided between the coils allowing access to be provided to the second fluid channel 535. A spiral channel, for example, may also be utilized for the first fluid channel 525, but such a configuration may block access to the second fluid channel, where the two channels may otherwise intersect. If identical fluids are being provided, this intersection may be provided in the channel scheme, but if different fluids or fluids of different temperature are being utilized, such an intersecting arrangement may not be practical.

Plate 500 may still further include purge outlets 555 that may be utilized to remove, limit, or prevent process byproducts from being deposited on the pedestal substrate support surface. The purge outlets 555 may be configured in one or more rings, or alternatively disposed in various positions across the plate 500. As illustrated in FIG. 5, as one example, the outlets are positioned in two rings, but any number of rings may be used including 0, 1, 2, 3, 4, 5, 6, 7, 8, etc., or more rings. As illustrated in the embodiment shown in FIG. 5, an inner ring includes purge outlets 555a, and an outer ring includes purge outlets 555b. Any number of outlets may be arranged on the plate 500. As illustrated, the inner ring may include about 12 or less purge outlets 555a. Alternatively, the inner ring may include less than or about 10, 8, 6, 4, or 2 outlets 555a, and in some embodiments, an inner ring of purge outlets 555a may not be included. Additionally, the outer ring may include more than, about 48, or less purge outlets 555b. Alternatively, the outer ring may include less than or about 40, 32, 24, 20, 16, 12, 8, 4, or 2 purge outlets 555b. Again, in some plate configurations, an outer ring of purge outlets 555b may not be included. Additional rings may also be utilized that include the same or a different number of purge outlets 555 as the inner and outer ring described.

Figure 6:
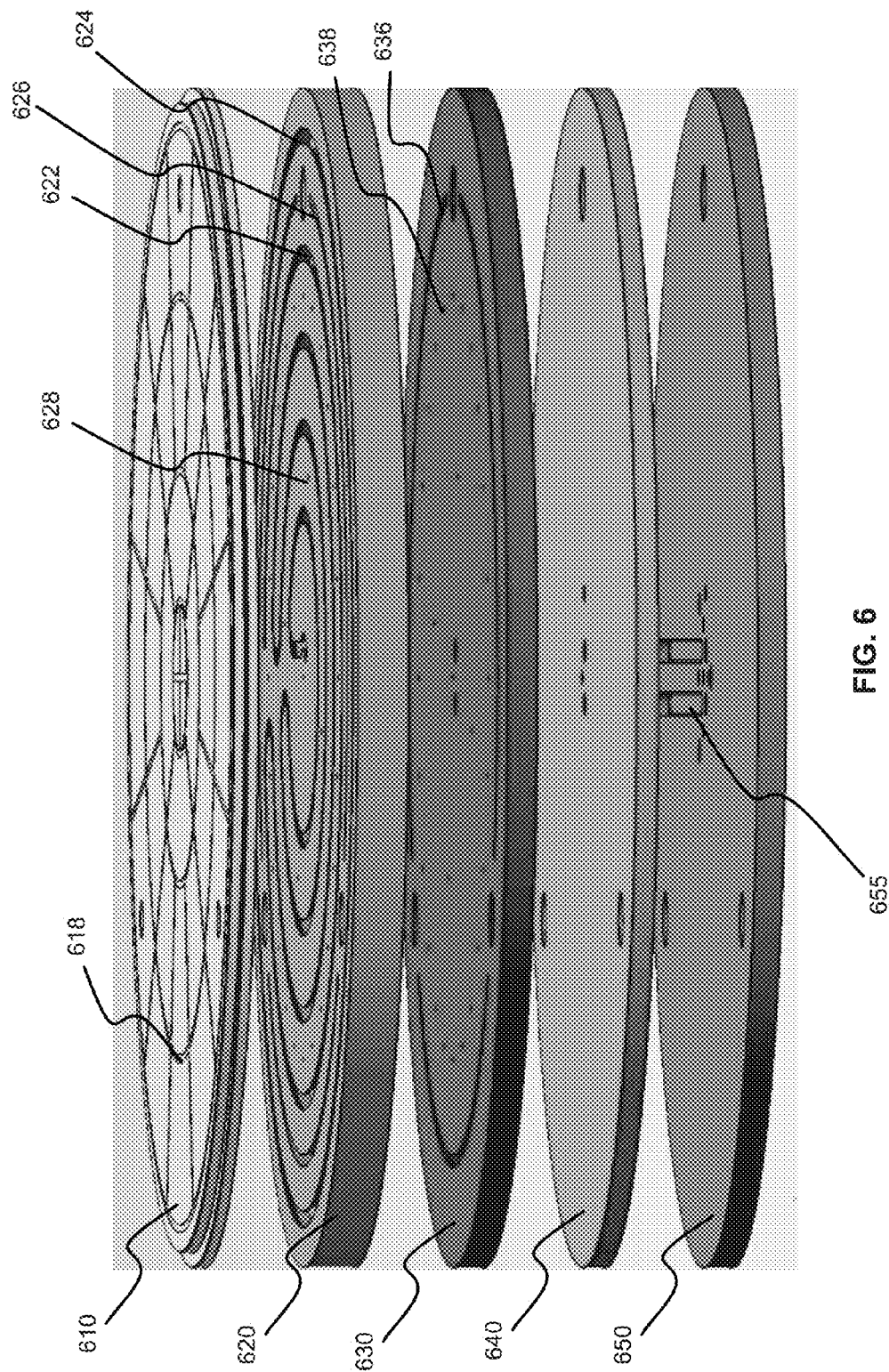
FIG. 6 shows an exploded perspective view of component plates of a pedestal according to embodiments of the present technology.

FIG. 6 shows an exploded perspective view of component plates of a pedestal according to embodiments of the present technology. As illustrated in the figure, five component plates are used, but more or less plates may be utilized in different embodiments of the technology. First plate 610 may comprise the substrate support surface on which a substrate may be positioned for processing. The plate may include at least a portion of purge gas outlets 618. Below first plate 610 may be a second plate 620. The second plate 620 may include areas defining at least part of the first and second portions of the first fluid channel 622, at least part of the third and fourth portions of the second fluid channel 624, and at least a first portion of the first purge channel 626. The second plate 620 may additionally include portions of the purge outlets 628 distributed across the plate.

Below second plate 620 may be a third plate 630. Third plate 630 may include areas defining at least a second portion of the first purge channel 636. The portion of the first purge channel 636 may be configured to be in fluid communication with the first portion of the first purge channel 626 defined by the second plate 620. The third plate may also include portions of the purge outlets 638 distributed across the plate. Below the third plate 630 may be a fourth plate 640. The fourth plate may provide additional insulation between the substrate support surface and the stem, and may additionally at least partly define the first purge channel that may be at least partly disposed on the backside of the third plate 630. Finally, a fifth plate 650 may be located below the fourth plate. The fifth plate may provide still additional thermal isolation between the substrate support surface and the stem, and in some embodiments, the fifth plate may include areas defining at least part of the third and fourth portions of the second fluid channel 655. The second temperature controlled fluid may be delivered from the stem internal channels, as described previously, and may be circulated across the fifth plate to connections (not shown) that deliver the temperature controlled fluid up to the second plate 620 for circulation through the second region of the pedestal. Each of the plates 620, 630, 640, and 650 may include additional connections through which the first temperature controlled fluid may be delivered to the first fluid channel 622 in second plate 620.

Figure 7:
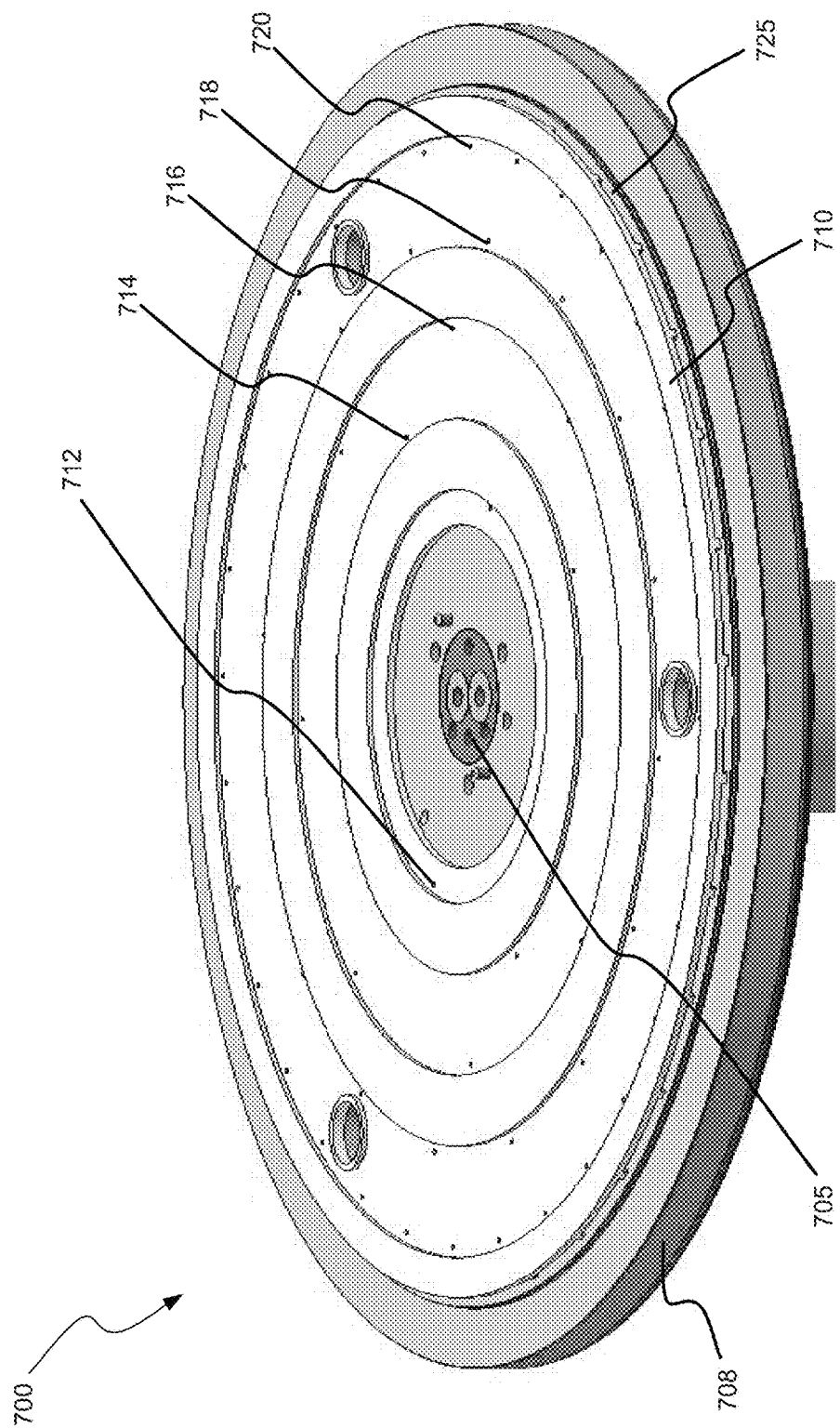
FIG. 7 illustrates a top perspective view of a component plate of a pedestal according to embodiments of the present technology.

FIG. 7 illustrates a top perspective view of a component plate of a pedestal 700 according to embodiments of the present technology. As illustrated, pedestal 700 may further include a purge distribution plate 710 that at least partially defines the second purge channel described previously. The distribution plate 710 may be made of a ceramic, or other material that may have a low thermal conductivity. The second purge channel may provide thermal isolation between the pedestal and stem, to improve the uniformity of the temperature profile across a substrate. When included below pedestal component plates, as illustrated in one example in FIG. 6, the second purge channel may be fully defined. A plurality of orifices may be utilized to further define the flow path of a purge gas within the second purge channel.

For example, purge gas may be delivered up through the stem through internal channels 705. The purge gas may then proceed under the fifth plate of the exemplary design of FIG. 6, or a bottom plate, to initial orifices 712 of purge distribution plate 710. The purge gas may flow through the orifices 712 and under the purge distribution plate 710 to an area that may be at least partially defined by stem base 708. The purge gas may flow back up through orifices 714, down through orifices 716, up through orifices 718, down through orifices 720, and then the purge gas may be delivered to the second isolation cavity 725. The purge distribution plate may include a greater or a fewer number of orifice paths depending on the application. The purge distribution plate may be made of a metal, ceramic, plastic, or other material that may facilitate flow of the purge gas, and/or minimize heat transfer between the stem and the pedestal.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a dielectric material" includes a plurality of such materials, and reference to "the application" includes reference to one or more applications and equivalents thereof known to those skilled in the art, and so forth.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A substrate support assembly comprising:
   a pedestal having a substrate support surface;
   a stem coupled with the pedestal opposite the substrate support surface, the stem including a pair of stem internal channels configured to deliver and receive a temperature controlled fluid to the pedestal;
   a fluid channel defined within a central region of the pedestal, the fluid channel coupled at an inlet section with, and configured to receive the temperature controlled fluid from, one of the pair of stem internal channels, coupled at an outlet section with, and configured to direct the temperature controlled fluid to, the other of the pair of stem internal channels, and including a first channel portion and a second channel portion between the inlet and the outlet sections, wherein the second channel portion is disposed vertically from and coupled in a parallel-reverse pattern with the first channel portion, and wherein the first and second channel portions are configured such that fluid received at the inlet section is directed through the first channel portion prior to flowing through the second channel portion and through the outlet section.

2. The substrate support assembly of claim 1, wherein the fluid channel is arranged in a coil pattern configured to direct the temperature controlled fluid from the inlet section radially outward through the pedestal.

3. The substrate support assembly of claim 1, wherein the stem comprises a heating means separate from the stem internal channels, and operable to maintain the stem at a temperature different from the pedestal.

4. The substrate support assembly of claim 1, wherein the first and second portions of the fluid channel are disposed vertically from each other in direct vertical alignment.

5. The substrate support assembly of claim 1, further comprising a purge channel having a distally located outwardly closed cavity, wherein the purge channel is defined within the pedestal at least partially below the fluid channel, and configured to receive a pressurized fluid from a stem purge channel that is contained within the purge channel to create a fluid barrier within the pedestal throughout the purge channel.

6. The substrate support assembly of claim 1, wherein the pedestal comprises a plurality of plates coupled with one another to form the pedestal.

7. A substrate support assembly comprising:
a pedestal having a substrate support surface;
a stem coupled with the pedestal opposite the substrate support surface, the stem including a pair of stem internal channels configured to deliver and receive a temperature controlled fluid to the pedestal;
a fluid channel defined within a central region of the pedestal, the fluid channel including a first channel portion and a second channel portion, wherein the second channel portion is disposed vertically from the first channel portion, and wherein the first and second channel portions are configured such that fluid is directed through the first channel portion prior to flowing through the second channel portion.

8. The substrate support assembly of claim 7, wherein the fluid channel is arranged in a coil pattern configured to direct the temperature controlled fluid radially outward through the pedestal via the first channel portion.

9. The substrate support assembly of claim 7, wherein the stem comprises a heater separate from the stem internal channels, wherein the heater is operable to maintain the stem at a temperature different from the pedestal.

10. The substrate support assembly of claim 7, wherein the first and second channel portions of the fluid channel are disposed vertically from each other in direct vertical alignment.

11. The substrate support assembly of claim 7, further comprising a purge channel having a distally located and outwardly closed cavity, wherein the purge channel is defined within the pedestal at least partially below the fluid channel, and configured to receive a pressurized fluid from a stem purge channel that is contained within the purge channel to create a fluid barrier within the pedestal throughout the purge channel.

12. The substrate support assembly of claim 7, wherein the pedestal comprises a plurality of plates coupled with one another to form the pedestal.

13. A substrate support assembly comprising:
a pedestal having a substrate support surface;
a stem coupled with the pedestal opposite the substrate support surface, the stem including a pair of stem internal channels configured to deliver and receive a temperature controlled fluid to the pedestal;
a fluid channel defined within a central region of the pedestal, the fluid channel including a first channel portion and a second channel portion, wherein the second channel portion is disposed vertically from the first channel portion; and
a purge channel having a distally located and outwardly closed cavity defined within the pedestal, wherein the purge channel is defined within the pedestal at least partially below the fluid channel and configured to receive a fluid from a stem purge channel.

14. The substrate support assembly of claim 13, wherein the purge channel is configured to contain the fluid to create a barrier within the pedestal throughout the purge channel.

15. The substrate support assembly of claim 13, wherein the fluid channel is arranged in a coil pattern configured to direct the temperature controlled fluid radially outward through the pedestal via the first channel portion.

16. The substrate support assembly of claim 13, wherein the stem comprises a heater separate from the stem internal channels, wherein the heater is operable to maintain the stem at a temperature different from the pedestal.

17. The substrate support assembly of claim 13, wherein the first channel portion and second channel portion of the fluid channel are disposed vertically from each other in direct vertical alignment.

18. The substrate support assembly of claim 13, wherein the pedestal comprises a plurality of plates coupled with one another to form the pedestal.

* * * * *